(12) United States Patent
Ikeda

(10) Patent No.: US 6,346,483 B1
(45) Date of Patent: Feb. 12, 2002

(54) FILM FORMING METHOD AND FILM FORMED BY THE METHOD

(75) Inventor: Yujiro Ikeda, Ikoma (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/589,455

(22) Filed: Jun. 8, 2000

(30) Foreign Application Priority Data

Jul. 2, 1999 (JP) ............................................. 11-189201

(51) Int. Cl.[7] ....................... H01L 21/302; H01L 21/461
(52) U.S. Cl. ........................ 438/706; 438/700; 438/704; 438/710; 438/396; 438/906
(58) Field of Search ................................ 438/706, 710, 438/906, 758, 905, 637, 700, 704, 587, 592, 655, 680, 253, 254, 396, 397, 634, 638, 740

(56) References Cited

U.S. PATENT DOCUMENTS

| | | | | |
|---|---|---|---|---|
| 5,643,633 A | * | 7/1997 | Telford et al. | 427/255 |
| 6,037,213 A | * | 3/2000 | Shih et al. | 438/253 |
| 6,125,859 A | * | 10/2000 | Kao et al. | 438/905 |

FOREIGN PATENT DOCUMENTS

| | | |
|---|---|---|
| JP | Hei (199)-2-218164 | 8/1990 |
| JP | Hei 8(1996)-186256 | 7/1996 |
| JP | Hei (1997)-213942 | 8/1997 |

* cited by examiner

Primary Examiner—Matthew Smith
Assistant Examiner—Igwe U. Anya
(74) Attorney, Agent, or Firm—Nixon & Vanderhye P.C.

(57) ABSTRACT

A film forming method includes forming a metal or silicide film by a deposition apparatus which is cleaned by passing a cleaning gas therethrough and subjected to an idle deposition using a material for the metal or silicide film intended to be formed within 24 hours after cleaning. Thereby the content of a halogen element in the formed film is reduced.

15 Claims, 2 Drawing Sheets

FILM FORMING METHOD AND FILM FORMED BY THE METHOD

ROSS-REFERENCE TO RELATED APPLICATION

This application is related to Japanese Patent Application No. HEI11(1999)-189201 filed on Jul. 2,1999, whose priority is claimed under 35 USC § 119, the disclosure of which is incorporated by reference in its entirety.

BACKGROUND OF THE INVENTION

1. Field of the Invention

The present invention relates to a method of forming a metal film or a silicide film in which the content of a halogen element is reduced and a film formed by the method. More particularly, the invention relates to a method of forming a metal film or a silicide film which has a reduced content of a halogen element, by use of a deposition apparatus having received a particular pretreatment, and a film formed by the method.

2. Description of Related Art

As halogen-containing films, known are WSi films which are used for gate electrodes of transistors (polycide films of WSi/polysilicon), for example. It is known that, in a polycide film produced by a conventional WSi film forming technique, oxidation is liable to take place at the interface between a WSi film and a polysilicon film due to fluorine in the WSI film during a thermal treatment step after the formation of the WSi and polysilicon films, and also that similar oxidation is liable to take place on sides of the WSi film after etching of the WSi and polysilicon films. To put it in further detail, the WSi film constituting the polycide film contains fluorine therein because the WSi film is usually formed by reaction of a $SiH_4$ gas with a $WF_6$ gas. Fluorine contained in the WSi film cuts a Si—O bond in a gate oxide film formed below the polycide film and substitutes for O atom. Cut-away O atoms react with a polysilicon film on the gate oxide film to form $SiO_x$. Thus oxide films are formed at the WSi-polysilicon interface or on the sides of the WSi film. This is referred to as abnormal oxidation hereinafter.

To cope with this problem, Japanese Unexamined Patent Publication No. HEI 9(1997)-213942 proposes introduction of nitrogen into the gate oxide film. According to this publication, because nitrogen introduced into the gate oxide film combines strongly with silicon or oxygen in the gate oxide film, fluorine cannot cut the Si—O bond in the gate oxide film. Therefore, the above-mentioned abnormal oxidation can be inhibited. However, the WSi film formed by this technique has the possibility of abnormal oxidation in positions other than the gate oxide film.

Also proposed is a method of forming a $SiO_2$ film and a $Si_3N_4$ film as oxidation protection films on the top and sides of the WSi film in production of the polycide film of WSi and polysilicon thereby to prevent a direct oxidation of the WSi film under high temperatures. However, with this method, the abnormal oxidation takes place at sides of the WSi film after the etching of the WSi and polysilicon films.

Further, Japanese Unexamined Patent Publication No. HEI 2(1990)-218164, taking notice of stress of the WSi film, proposes a method of depositing a P—$Si_3N_4$ film on the polycide film of WSi and polysilicon to offset the stress of the WSi film and selectively oxidize the sides of the polycide film using the P—$Si_3N_4$ film as a mask to form sidewall films. With this method, improvement can be made with regard to the stress of the WSi film. However, as shown in FIG. 3, the abnormal oxidation may occur at an interface 10 between the WSi film on the sides of the polycide and the sidewall oxide film because the fluorine content in the WSi film is not controlled.

Japanese Unexamined Patent Publication No. HEI 8(1996)-186256 proposes a method of forming a $SiO_2$ film, a $Si_3N_4$ film and the like on the top and sides of the polycide film of WSi and polysilicon to prevent exfoliation of the WSi film (see FIG. 4). However, with this method, there is a problem in that cracks take place in the WSi film if a rapid thermal treatment is conducted at a high temperature of 800 to 900° C. for forming the $SiO_2$ film.

With the above-described conventional methods of forming the WSi film, the actual situation is that there still occur the abnormal oxidation of the WSi film, especially abnormal oxidation at the sides of the WSi film after the etching of the WSi and polysilicon films, and cracks and film exfoliation in the WSi film at the forming the polycide film of WSi/polysilicon.

SUMMARY OF THE INVENTION

Accordingly, in view of this situation, an object of the present invention is to provide a method of forming a film containing a halogen element in a reduced content, for preventing the abnormal oxidation, exfoliation and cracking of the film, and a film obtained by the method.

With the intention of solving the above-mentioned problems, the inventors of the present invention have paid attention to conditions for pretreatment of a deposition apparatus. Usually, before deposition is carried out, the deposition apparatus is cleaned by a cleaning gas passed through the deposition apparatus to remove residual substances of a gas used for the previous deposition and dust resulting therefrom. Or after cleaning, the apparatus is often left under a reduced pressure for a long time, and thereafter an idle deposition is sometimes conducted. Unexpectedly, the inventors have found out that the content of a halogen element in a film can be effectively reduced if the film is formed by a deposition apparatus having had an idle deposition within a certain time period after cleaning and have accomplished the present invention.

The present invention provides a film forming method comprising forming a metal film or a silicide film in which the content of a halogen element is reduced, with use of a deposition apparatus which is cleaned by passing a cleaning gas therethrough and subjected to an idle deposition using a material for the intended metal or silicide film within 24 hours after cleaning.

The present invention also provides a WSi film formed by the above-described method whereby the fluorine content is reduced to $4 \times 10^{16}$ atms/cm$^3$ or less.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
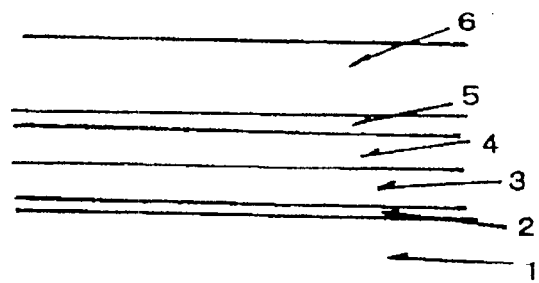
FIGS. 1(a) to 1(e) are schematic sectional views illustrating production steps of a polycide film using the method of the present invention.

According to the method of the present invention, a metal or silicide film in which the content of a halogen element is reduced is formed by a deposition apparatus on which an idle deposition has been carried out with use of a material for the intended metal or silicide film within 24 hours after the cleaning of the deposition apparatus by passing a cleaning gas through the deposition apparatus.

The deposition apparatus may be any one suitable for conducting a process of forming the intended metal or silicide film, for example, a known method such as a sputtering method, an atmospheric CVD method, an LPCVD method or the like. The deposition apparatus is cleaned by passing a cleaning gas in the deposition apparatus. The cleaning gas can remove residual gases remaining on the inner wall of the deposition apparatus and dusts resulting from the residual gas.

The cleaning gas is not particularly limited and may be any one usually used for cleaning deposition apparatuses. For example, mentioned are $NF_3$, $N_2$ and inert gases such as He, Ne, Ar, Kr, Xe and Rn, which may be used singly or as a combination. The flow-in rate of the cleaning gas may be 200 to 2,000 cc/min., for example. The cleaning time may be 4 to 40 minutes, for example.

The idle deposition in the context of the present invention means to operate the deposition apparatus under the same conditions as a film is deposited, but without placing in the deposition apparatus a sample on which the film is to be deposited.

The idle deposition may be conducted by a known method, for example, the sputtering method, the atmospheric CVD method, the LPCVD method or the like. Film forming conditions may be adjusted as appropriate according to the kind of the deposition apparatus used and the kind of the film intended to form.

By the idle deposition, the inner wall of the deposition apparatus is coated with a film of the metal or silicide for the film intended to be formed.

According to the method of the present invention, the idle deposition is carried out within 24 hours, preferably within an hour, after the deposition apparatus is cleaned. If it is carried out more than 24 hours after cleaning, the content of the halogen element in the resulting film becomes high and the abnormal oxidation takes place at high temperatures. Besides, where the WSi film is formed on a polysilicon film, for example, the abnormal oxidation occurs at the polysilicon-WSi interface and the sides of the WSi film. Also the films have an increased possibility of exfoliation after thermal treatment.

According to the method of the present invention, the metal or silicide film may be formed in the same manner as in the idle deposition. The film forming conditions may be adjusted as appropriate according to the kind of the deposition apparatus used and the kind of the film intended to be formed.

The metal or silicide film having a reduced content of a halogen element that is formed by the present invention is not particularly limited provided that it is a film formed with use of a material gas containing a halogen element. For example, mentioned are WSi films, titanium films, titanium nitride films, MoSi films and the like.

The gas used for forming the film may be appropriately selected according to the film intended to be formed. For example, if a WSi film is to be formed, a $SiH_2Cl_2$ gas, a $SiH_4$ gas, a $WF_6$ gas and the like may be mentioned. If a titanium film is to be formed, a $TiCl_4$ gas and the like may be mentioned. If a titanium nitride film is to be formed, a $TiCl_4$ gas, a $N_2(NH_3)$ gas and the like may be mentioned. If a MoSi film is to be formed, a $MoCl_5$ gas, a $SiCl_4$ gas and the like may be mentioned.

The WSi film formed by the method of the present invention has a low fluorine content, preferably a fluorine content of $4 \times 10^{16}$ atoms/cm$^3$ or less. A composition ratio W/Si in the WSi film is not particularly limited, but preferably 2.5 to 2.6.

The WSi film formed by the method of the present invention is usually annealed.

Annealing is conducted by a known method, for example, electric oven annealing, laser annealing, lamp annealing or the like.

According to the present invention, instead of such conventional annealing techniques, the WSi film may be annealed by forming an oxide film on the WSi film under a first deposition temperature and then forming a nitride film on the oxide film under a second deposition temperature higher than the first deposition temperature.

The first deposition temperature here means a temperature which is usually set for forming an oxide film and does not cause cracking in the WSi film. For example, the first deposition temperature may be 350 to 500° C., preferably 380 to 450° C.

The oxide film may be formed by a method which is not particularly limited, and it may be formed by a known method, for example, sputtering, atmospheric CVD, LPCVD, thermal oxidation, spin on glass (SOG) or the like.

As a gas used for forming the oxide film, may be mentioned a TEOS ($Si(C_2H_5O)_4$) gas, a $SiCl_4$ gas, an $O_2$ gas and the like, among which TEOS is preferable.

The nitride film is formed under the second deposition temperature higher than the first deposition temperature. The second deposition temperature may be 650 to 850° C., preferably 700 to 800° C. The nitride film may be formed by a method which is not particularly limited, and it may be formed by a known method, for example, atmospheric CVD, LPCVD or the like.

As a gas used for forming the nitride film, may be mentioned a $SiH_2Cl_2$ gas, a $SiCl_4$ gas, an $SiH_4$ gas, a $NH_3$ gas and the like, among which a combination use of $SiH_2Cl_2$ and $NH_3$ is preferable.

Before the formation of the nitride film, impurities on the surface of the oxide film and moisture in the oxide film may be removed by being pumped out to densify the oxide film.

As described above, as the oxide film is formed under the first temperature and the nitride film is formed under the second temperature higher than the first temperature, the WSi film is consequently annealed and crystallized.

After the WSi film is formed by the film forming method of the present invention, protective oxide films may be formed on sides of the WSi film.

EXAMPLE

A film formation process of a WSi film in a polycide film of WSi/polysilicon is now explained as an example of the present invention with reference to the accompanying figures. However, the present invention is not limited to this example.

First, as shown in FIG. 1(a), a gate oxide film 2 of 7 nm thickness is formed on a Si substrate 1. A polysilicon film 3 of 100 nm thickness is formed on the gate oxide film 2 by LPCVD at a deposition temperature of 620° C. film 3, an impurity 31P+ is injected at an energy of 20 keV and a dose of $3 \times 10^{15}$ atoms/cm². Thereafter, the polysilicon film 3 is annealed in an atmosphere of a $N_2$ gas at 800° C. for 30 minutes to activate the impurity doped in the polysilicon film 3. An oxide film having grown on the polysilicon film 3 through this annealing is removed with a diluted HF. Then a WSi film 4 having a W/Si composition ratio of 2.5 to 2.6 is formed to a thickness of 100 nm on the polysilicon film 3 in such a manner that the content of an impurity of fluorine is $4 \times 10^{16}$ atoms/cm³ or lower.

The formation of the WSi film 4 is explained in further detail. Here the WSi film is formed by atmospheric CVD, and therefore, a deposition apparatus used for atmospheric CVD is used. Since the metal attached to the inner wall of a chamber of the deposition apparatus results in dust, the inner wall of the chamber of the deposition apparatus is cleaned with a $NF_3$ gas under a reduced pressure. The pressure at this time is 400 Pa and the $NF_3$ gas is passed through the chamber at a flow rate of 200 cc/minute continuously for 20 minutes.

Within an hour after cleaning, an idle deposition is carried out at 500° C. under 160 Pa for 5 minutes with use of a $WF_6$ gas (3.5 cc/min.) and a $SiH_2Cl_2$ gas (175 cc/min.) thereby to coat the inner wall of the chamber with WSi.

Next, the semiconductor substrate having the polysilicon film 3 formed thereon is put in the deposition apparatus, and the WSi film 4 is formed on the polysilicon film 3 at a deposition temperature of 550° C. under a deposition pressure of 160 Pa with use of $SiH_2Cl_2$ (175 sccm), $WF_6$ (3.5 sccm) and Ar (825 sccm).

Next, on the WSi film 4, a $SiO_2$ film 5 of 50 nm thickness is formed by atmospheric CVD at a deposition temperature of 400° C. under a deposition pressure of 4600 Pa with use of TEOS 250 mg at an $O_3$ content of 4 wt % and an $O_3/O_2$ gas (5,000 sccm).

Subsequently, impurities on the surface of the $SiO_2$ film 5 and moisture in the $SiO_2$ film 5 are pumped out for removal, thereby to densify the $SiO_2$ film 5.

Subsequently, a $Si_3N_4$ film 6 is formed to a thickness of 200 nm on the $SiO_2$ film 5 by LPCVD at a deposition temperature of 770° C. under a deposition pressure of 20 Pa with use of $NH_3$ (540 sccm) and $SiH_2Cl_2$ (72 sccm).

As described above, because the WSi film 4 is heated to 400° C. when the $SiO_2$ film 5 is formed and further to 770° C. when the $Si_3N_4$ film 6 is formed, the WSi film 4 is annealed.

Figure 1B:
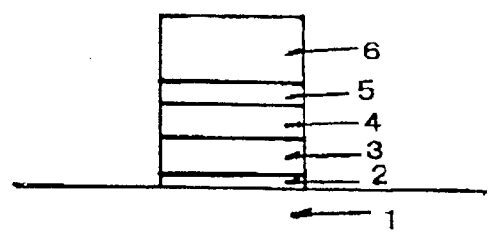

Next, a resist pattern is formed on the $Si_3N_4$ film by photolithography so that the $Si_3N_4/SiO_2$/WSi/polysilicon will be made into lines of 0.30 μm width, and then the $Si_3N_4/SiO_2$/WSi/polysilicon is etched by dry etching (see FIG. 1(b)).

Figure 1C:
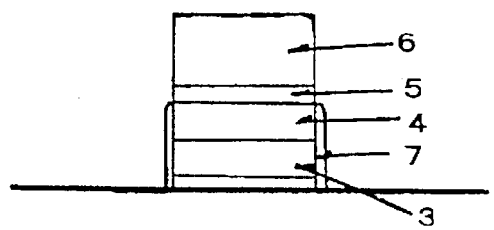

Subsequently, a protective oxide film 7 of 10 nm thickness is formed on the sides of the WSi/polysilicon at a deposition temperature of 900° C. for 60 minutes with use of an $O_2$ gas (15 l/min.) (see FIG. 1(c)).

Figure 1D:
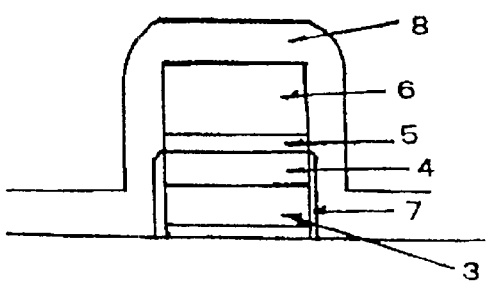
Figure 1E:
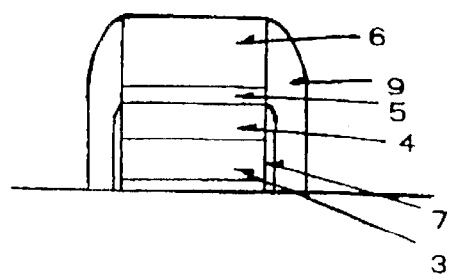
Figure 2:
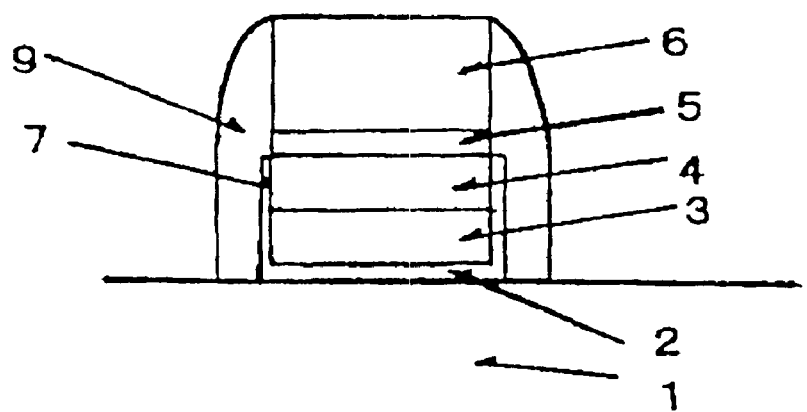
FIG. 2 is a sectional view of a polycide film produced using the method of the present invention.
Figure 3:
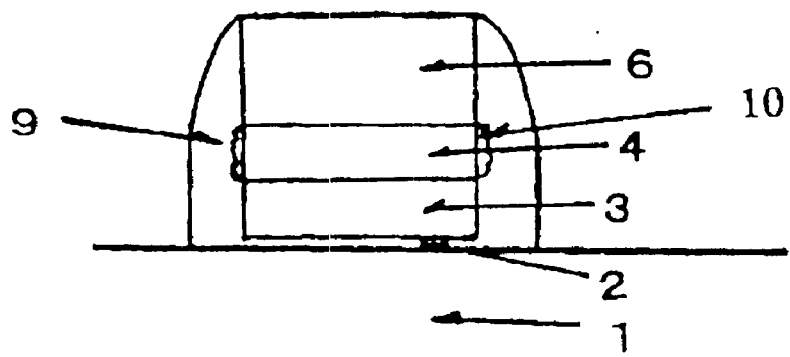
FIG. 3 is a sectional view of a polycide film produced by a conventional method.
Figure 4:
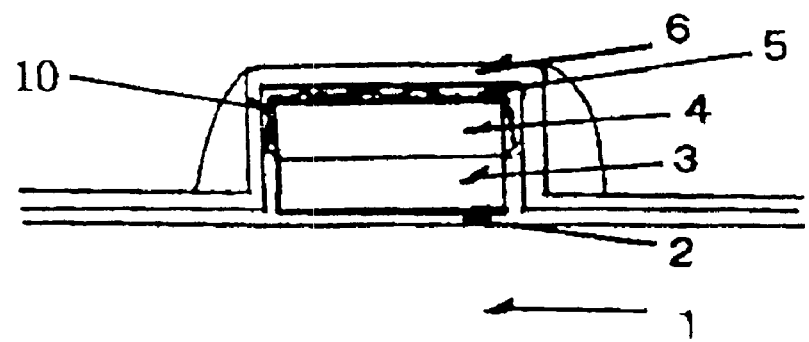
FIG. 4 is a sectional view of a polycide film produced by a conventional method.

Next, in order to produce a transistor of an LDD structure, a $Si_3N_4$ film 8 of 100 nm thickness is formed by LPCVD on the entire surface of the semiconductor substrate having a gate electrode formed thereon, at a deposition temperature of 770° C. under a deposition pressure of 20 Pa with use of $NH_3$ (540 sccm) and $SiH_2Cl_2$ (72 sccm) (see FIG. 1(d)). Then, the entire surface of the $Si_3N_4$ film 8 is etched back by dry etching to form a side wall film 9 (of 100 nm thickness) of $Si_3N_4$ on the sides of the polycide (see FIG. 1(e)).

The occurrence of the abnormal oxidation at the WSi-polysilicon interface and on the sides of the WSi film can be checked by conducting an SEM test. In this example, the SEM test was conducted after the protective oxide film 7 was formed on the sides of WSi/polysilicon. The results showed that the abnormal oxidation was not observed at the WSi-polysilicon interface and on the sides of the WSi film 4.

According to the method of this example, mainly by forming the WSi film by the deposition apparatus having received the particular pretreatment so as to reduce the fluorine content in the WSi film to a certain value or less, the abnormal oxidation can be prevented from occurring at the WSi-polysilicon interface and on the sides of the WSi film and the exfoliation and cracking of the WSi film can be inhibited.

Table 1 shows a relationship between the fluorine content and abnormal oxidation in the WSi film.

TABLE 1

| Fluorine Content (atoms/cm³) | Abnormal Oxidation |
| --- | --- |
| $4 \times 10^{16}$ | NO |
| $2 \times 10^{17}$ | YES |

It is understood from Table 1 that no abnormal oxidation is seen in a WSi film having a fluorine content of $4 \times 10^{16}$ atoms/cm³.

According to the film forming method of the present invention, a metal film or a silicide film can be formed to have a reduced content of a halogen element. Therefore, it is possible to inhibit the abnormal oxidation and reduce the exfoliation and cracking of the film, which enables the formation of stable films.

What is claimed is:

1. A film forming method comprising:
    cleaning a deposition apparatus by passing a cleaning gas therethrough;
    within 24 hours after said cleaning, subjecting the deposition apparatus to an idle deposition using a material for a metal or silicide film intended to be formed so that inner walls of the deposition apparatus are coated with the material when no sample or substrate is in the apparatus, and
    after said cleaning and idle deposition, forming a metal or silicide film on a substrate or sample in the deposition apparatus so that the content of a halogen element in the formed metal or silicide film is reduced.

2. A film forming method according to claim 1, wherein the idle deposition is carried out within an hour after the deposition apparatus is cleaned.

3. A film forming method according to claim 1, wherein the cleaning gas is at least one selected from the group consisting $NF_3$, $N_2$, He, Ne, Ar, Kr, Xe and Rn.

4. A film forming method according to claim 1, wherein the cleaning is carried out under the condition of a flow-in rate of 200 to 2,000 cc/min for the cleaning gas.

5. A film forming method according to claim 1, wherein the cleaning is carried out for 4 to 40 minutes.

6. A film forming method according to claim 1, wherein the idle deposition is conducted by a sputtering method, an atmospheric CVD method or an LPCVD method.

7. A film forming method according to claim 1, wherein the intended metal or silicide film is a WSi film.

8. A film forming method according to claim 7, wherein, after a WSi film is formed on the sample or substrate, an oxide film is formed on the WSi film and on the sample or substrate at a predetermined deposition temperature and subsequently a nitride film is formed on the oxide film and on the sample or substrate at a deposition temperature higher than said predetermined deposition temperature, thereby to anneal the WSi film.

9. A film forming method according to claim 8, wherein, the oxide film is formed at a deposition temperature of 380° C. to 450° C. using TEOS and the nitride film is formed at a deposition temperature of 700° C. to 800° C. using a $SiH_2Cl_2$ gas and a $NH_3$ gas.

10. A film forming method according to claim 8, wherein the oxide film is formed by a sputtering method, an atmospheric CVD method, an LPCVD method, a thermal oxidation method or a spin on glass (SOG) method.

11. A film forming method according to claim 8, wherein the nitride film is formed by an atmospheric CVD method or an LPCVD method.

12. A film forming method according to claim 8, wherein impurities on the surface of the oxide film and moisture in the oxide film are removed by being pumped out so that the oxide film is densified before the formation of the nitride film.

13. A WSi film formed on a substrate or sample by a method as set forth in claim 7, whereby the content of fluorine in the WSi film is reduced to $4 \times 10^{16}$ atoms/cm$^3$ or less.

14. A WSi film according to claim 13, wherein the WSi film has a composition ratio W/Si of 2.5 to 2.6.

15. A method of forming a metal or silicide film, the method comprising:

cleaning a deposition apparatus by passing a cleaning gas therethrough;

following said cleaning, subjecting the deposition apparatus to an idle deposition with no substrate or sample in the apparatus in order to coat inner walls of the apparatus with a material for a metal or silicide film, said idle deposition being performed within 24 hours after said cleaning; and following said cleaning and said idle deposition, passing a sample or substrate through the apparatus in order to form the metal or silicide film of said material thereon in a manner so that a halogen element in the formed metal or silicide film is reduced.

* * * * *